United States Patent [19]

Niehenke et al.

[11] Patent Number: 5,517,687
[45] Date of Patent: May 14, 1996

[54] SUBHARMONIC IMAGE REJECTION AND IMAGE ENHANCEMENT MIXER

[75] Inventors: Edward C. Niehenke; Marvin Cohn, both of Baltimore; Peter A. Stenger, Woodbine, all of Md.

[73] Assignee: Westinghouse Electric Corporation, Pittsburgh, Pa.

[21] Appl. No.: 194,199

[22] Filed: Feb. 9, 1994

[51] Int. Cl.⁶ ........................................... H04B 1/26
[52] U.S. Cl. ............................... 455/325; 455/327
[58] Field of Search ............................ 455/302, 304, 455/379, 320, 325, 327, 330, 303, 305, 306, 317, 318

[56] References Cited

U.S. PATENT DOCUMENTS

| | | | |
|---|---|---|---|
| 3,681,697 | 8/1972 | Moroney | 455/302 |
| 3,939,430 | 2/1976 | Dickens et al. | |
| 4,457,022 | 6/1984 | Dydyk | |
| 4,553,265 | 11/1985 | Clifton et al. | |
| 4,607,394 | 8/1986 | Nightingale | 455/327 |
| 4,955,079 | 9/1990 | Connerney et al. | |

FOREIGN PATENT DOCUMENTS

| | | | |
|---|---|---|---|
| 2608939 | 8/1977 | Germany | 455/327 |

Primary Examiner—Reinhard J. Eisenzopf
Assistant Examiner—Thanh Le

[57] ABSTRACT

A subharmonic image rejection and image enhancement mixer for mixing millimeter wavelength signals using a low conversion loss technique is described. A local oscillator frequency from an external source is fed to a first subharmonic mixer and through a phase shifter to a second subharmonic mixer. The phase shifter delays the local oscillator signal by (90°/n), where n is the multiple of the subharmonic mixers and is greater than 1. The first and second subharmonic mixers mix the local oscillator frequency with an input signal, which includes a desired frequency and an image frequency, to produce an intermediate frequency having a desired component and an image component at a select phase. A 0°–90° hybrid separates and terminates the image component of the intermediate frequency. The input port that feeds the input signal to each subharmonic mixer is dimensioned so as to provide a virtual image short termination or an image short termination to a self-generated image signal from each subharmonic mixer, thereby decreasing the conversion loss of the frequency mixer.

7 Claims, 5 Drawing Sheets

SUBHARMONIC IMAGE REJECTION AND IMAGE ENHANCEMENT MIXER

BACKGROUND OF THE INVENTION

1. Field of the Invention

The present invention relates generally to frequency mixers, and more particularly to subharmonic mixers employing low conversion loss techniques for millimeter wavelength systems.

2. Discussion of Related Art

To optimally detect radio frequency (RF) signals, most electronic receivers convert received RF signals to lower intermediate frequencies. The filtering and amplification performed in detecting intermediate frequencies require less expensive electrical components than those required for accurate detection at RF. Detection at intermediate frequencies also can improve receiver gain, dynamic range, and stability.

Typical RF receivers employ mixers to convert the received RF signal to a lower intermediate frequency. Frequency shifting occurs by mixing, or taking the difference between, the received RF signal and a reference frequency from a local oscillator. The difference between a desired frequency within the received RF signal and the local oscillator frequency is the intermediate frequency. That is, the desired frequency is setoff from the local oscillator frequency by the intermediate frequency.

The received RF signal, however, may also contain noise and other interfering signals. If the noise or the other interfering signals are setoff from the local oscillator frequency by the intermediate frequency, the mixing of the noise or the other interfering signals with the local oscillator frequency will also produce noise at the intermediate frequency. This noise or other interfering signals may be at the image frequency and can degrade the overall noise figure of the mixer by about 3 dB for single sideband operation.

Mixers also generate harmonics and other mixing products of the local oscillator signal. Some of these products, e.g., the sum frequency (signal plus the local oscillator) and the image (twice the local oscillator minus the signal) are derived from the desired frequency. If these products are not remixed with the local oscillator frequency and converted to the intermediate frequency, the mixer will exhibit an increased conversion loss.

Conventional approaches to alleviating an increase in noise figure due to amplified image frequency noise have involved either filtering or phasing techniques. For receiver systems having narrow RF bandwidths and high intermediate frequencies, a filter is often inserted between the front end amplifier and the mixer to attenuate the image frequency noise. For broad RF bandwidths and/or low intermediate frequencies, image rejection by phasing to separate and terminate the intermediate frequency caused by the image frequency has been used.

To lower the conversion loss caused by self-generated products such as the image frequency, conventional mixers have employed image enhancement techniques. These techniques have attempted to reflect the image back into the mixer for conversion to the intermediate frequency.

Conventional image rejection and image enhancement techniques, however, do not encompass the necessities of emerging millimeter wavelength systems. In such systems, a local oscillator frequency that is set off from the desired frequency by the intermediate frequency might have to be upwards of 94 GHz. This local oscillator frequency may not be readily available. If a sub-multiple of that local oscillator frequency is used, a frequency multiplier is required to adjust the sub-multiple up to the local oscillator frequency.

In light of the foregoing, there is a need for a harmonic frequency mixer for millimeter wavelength systems that does not require a separate multiplier and that incorporates image rejection and image enhancement to achieve low conversion loss while being pumped by an oscillator at a sub-multiple of the usual local oscillator frequency.

SUMMARY OF THE INVENTION

Accordingly, the present invention is directed to a frequency mixer that substantially obviates one or more of the limitations and disadvantages of the described prior arrangements.

Additional advantages of the invention will be set forth in the description that follows, and in part will be apparent from the description, or may be learned by practice of the invention. The advantages of the invention will be realized and attained by the apparatus particularly pointed out in the written description and claims hereof as well as the appended drawings.

To achieve these and other advantages and in accordance with the purpose of the invention, as embodied and broadly described herein, the invention comprises a frequency mixer comprising a power divider having an input for receiving a local oscillator frequency, a first output, and a second output, a phase shifter for delaying the local oscillator frequency by $(90°/n)$ having an input coupled to the first output of the power divider and an output, n being greater than 1, input means for receiving an input signal and for causing reflection of a self-generated image signal. The frequency mixer further comprises a first subharmonic mixer having a local oscillator input coupled to the second output of the power divider, an input signal input coupled to the input means, and an output. The first subharmonic mixer produces an intermediate frequency at the output, where the intermediate frequency includes a first desired component and a first image component. The frequency mixer further comprises a second subharmonic mixer having a local oscillator input coupled to the output of said phase shifter, an input signal input coupled to the input means, and an output, where the second subharmonic mixer produces the intermediate frequency at the output, and the intermediate frequency includes a second desired component and a second image component, and a quadrature hybrid having a first input and a second input coupled to the outputs of the first and second subharmonic mixers respectively, a first output, and a second output, where the quadrature hybrid produces a sum of the first desired component and the second desired component at the first output and a sum of the first image component and the second image component at the second output.

In another aspect, the invention comprises a method for combining an input signal with a local oscillator frequency to obtain an intermediate frequency, comprising the steps of dividing a signal having a local oscillator frequency into a first output and a second output, shifting the phase of the local oscillator frequency on the second output by $(90°/n)$, n being greater than 1, applying an input signal to a first and second subharmonic mixer, mixing the local oscillator frequency and the input signal to produce the intermediate frequency, where the intermediate frequency includes a first desired component and a first image component, mixing the shifted local oscillator frequency and the input signal to produce the intermediate frequency, where the intermediate frequency has a second desired component and a second image component, reflecting a self-generated image signal into one of the first and second subharmonic mixers, and producing a sum of the first desired component and the second desired component separate from a sum of the first image component and the second image component.

It is understood that both the foregoing general description and the following detailed description are exemplary and explanatory and are intended to provide further explanation of the invention as claimed.

The accompanying drawings, which are incorporated in and constitute a part of this specification, illustrate several embodiments of the invention and together with the description serve to explain the principles of the invention.

DETAILED DESCRIPTION OF THE PREFERRED EMBODIMENTS

Figure 1:
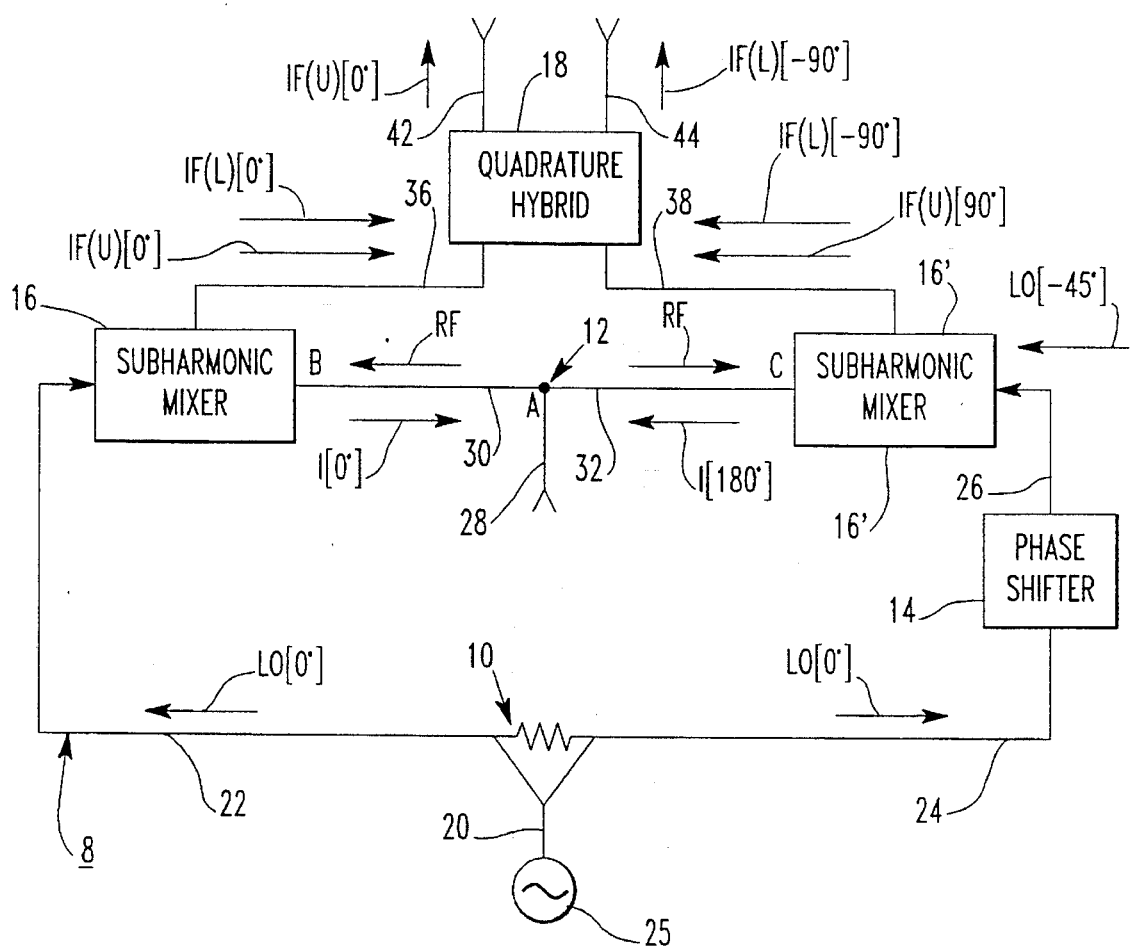
FIG. 1 is a schematic diagram of a subharmonic image rejection and image enhancement mixer according to a first embodiment of the present invention.

Reference will now be made in detail to the present preferred embodiments of the invention, examples of which are illustrated in the accompanying drawings. Wherever possible, the same reference numbers will be used throughout the drawings to refer to the same or like parts.

In accordance with the present invention, a subharmonic image rejection and image enhancement mixer for the purpose of combining an input signal with a local oscillator frequency to obtain an intermediate frequency, where the input signal has at least a desired frequency and an image frequency that are offset from a multiple n of the local oscillator frequency by the intermediate frequency, comprises a power divider, an input means, a phase shifter, two subharmonic mixers, and a quadrature hybrid. Under the arrangement of FIG. 1, the mixer of the present invention achieves image enhancement using a virtual image short termination technique.

As herein embodied, power divider 10 serves as a first input to the mixer generally referred to at 8. The power divider 10 has an input path 20, a first output path 22, and a second output path 24 and receives a local oscillator signal from an external source such as a local oscillator 25. The local oscillator signal provides a very stable reference frequency $f_{LO}$ for the mixing operation. Preferably, a Wilkinson-type power divider is used so that the local oscillator signal is passed to the first output path 22 and the second output path 24 substantially in phase. Due to the power divider 10, the power of the local oscillator signal 25 at each of the first and second output paths 22 and 24 is one-half of the power of the local oscillator signal received at the input path 20.

The first output path 22 of the power divider 10 is connected directly to a local oscillator input of a first subharmonic mixer 16. The second output path 24 is connected to an input of a phase shifter 14. The phase shifter 14 delays the local oscillator signal LO on the second output path 24 by a multiple (90°/n) of the $f_{LO}$ wavelength, where n corresponds to a submultiple for the subharmonic mixers described below. For X2 subharmonic mixers where n equals 2, as shown in FIG. 1, the phase shifter 14 shifts the phase of $f_{LO}$ on the second output path 24 by −45°. The phase shifter 14 and, therefore, the local oscillator signal LO are coupled to a local oscillator input 26 on a second subharmonic mixer 16'.

Similarly, an input port 12 serves as a second input to the mixer. The input port 12 comprises an input arm 28, a first output arm 30, and a second output arm 32 and receives an input signal RF from an external source, such as a low noise amplifier. The input signal RF is often variable and may contain target velocity information in a radar application, for example. The first output arm 30 of the input port 12 is connected to an RF signal input on the first subharmonic mixer 16, and the second output arm 32 is connected to an RF signal input on the second subharmonic mixer 16'. As shown in FIG. 1, the first output arm 30 extends between points A and B, and the second output arm 32 extends between points A and C. The input arm 28, the first output arm 30, and the second output arm 32 join at the point A. The length A–B of the first output arm 30 is substantially equal to the length A–C of the second output arm 32. Thus, the input signal RF enters the RF signal input 30 of the first subharmonic mixer 16 in phase with the input signal RF entering the RF signal input 32 on the second subharmonic mixer 16'.

Each of the subharmonic mixers 16 and 16' has a local oscillator input 22 and 26, an RF signal input 30 and 32, and an output 36 and 38. The subharmonic mixers 16 and 16' may be single-ended, balanced, or double-balanced, for example. The subharmonic mixers 16 and 16' each produce an intermediate frequency $f_{IF}$ at the output 36 and 38 corresponding to the difference between the input signal RF received at the respective RF signal input 30 or 32 and the local oscillator frequency $f_{LO}$ received at the respective local oscillator input 22 or 26. The subharmonic mixers are selected to operate at a submultiple n for a desired application. Specifically for the layout depicted in FIG. 1, the subharmonic mixers 16 and 16' are X2 subharmonic mixers, where n equals 2. That is, the output 36 and 38 of each subharmonic mixer 16 and 16' is the difference between the input signal RF and twice the local oscillator frequency $f_{LO}$ of the local oscillator 25.

As shown in FIG. 1, the input signal RF received at the input port 12 has at least a desired RF frequency $f_{RF(U)}$ and an image RF frequency $f_{RF(L)}$. The desired RF frequency $f_{RF(U)}$ contains desired information to be processed by the receiver system. The image RF frequency $f_{RF(L)}$, in certain applications, may be noise caused by amplification of the input signal RF before the input signal reaches the input port 12. The desired RF frequency may be $f_{RF(U)}$ with an associated image RF frequency $f_{RF(L)}$. For future reference, it will be assumed that the desired RF frequency in $f_{RF(U)}$ and the associated image RF frequency is $f_{RF(L)}$. The desired RF frequency $f_{RF(U)}$ is offset from the image RF frequency $f_{RF(L)}$ by twice the intermediate frequency $f_{IF}$. Further, the desired RF frequency $f_{RF(U)}$ and the image RF frequency $f_{RF(L)}$ are both separated from twice the local oscillator frequency $f_{LO}$ by the intermediate frequency $f_{IF}$. In other terms, $f_{RF(U)}=f_{2LO}+f_{IF}$ and $f_{RF(L)}=f_{2LO}-f_{IF}$. Due to these relationships, the mixing of the local oscillator frequency $f_{LO}$ with either the desired RF frequency $f_{RF(U)}$ or the image RF frequency $f_{RF(L)}$ in one of the subharmonic mixers 16 or 16' will result in the intermediate frequency $f_{IF}$ at the output 36 or 38 of that subharmonic mixer.

Figure 2:
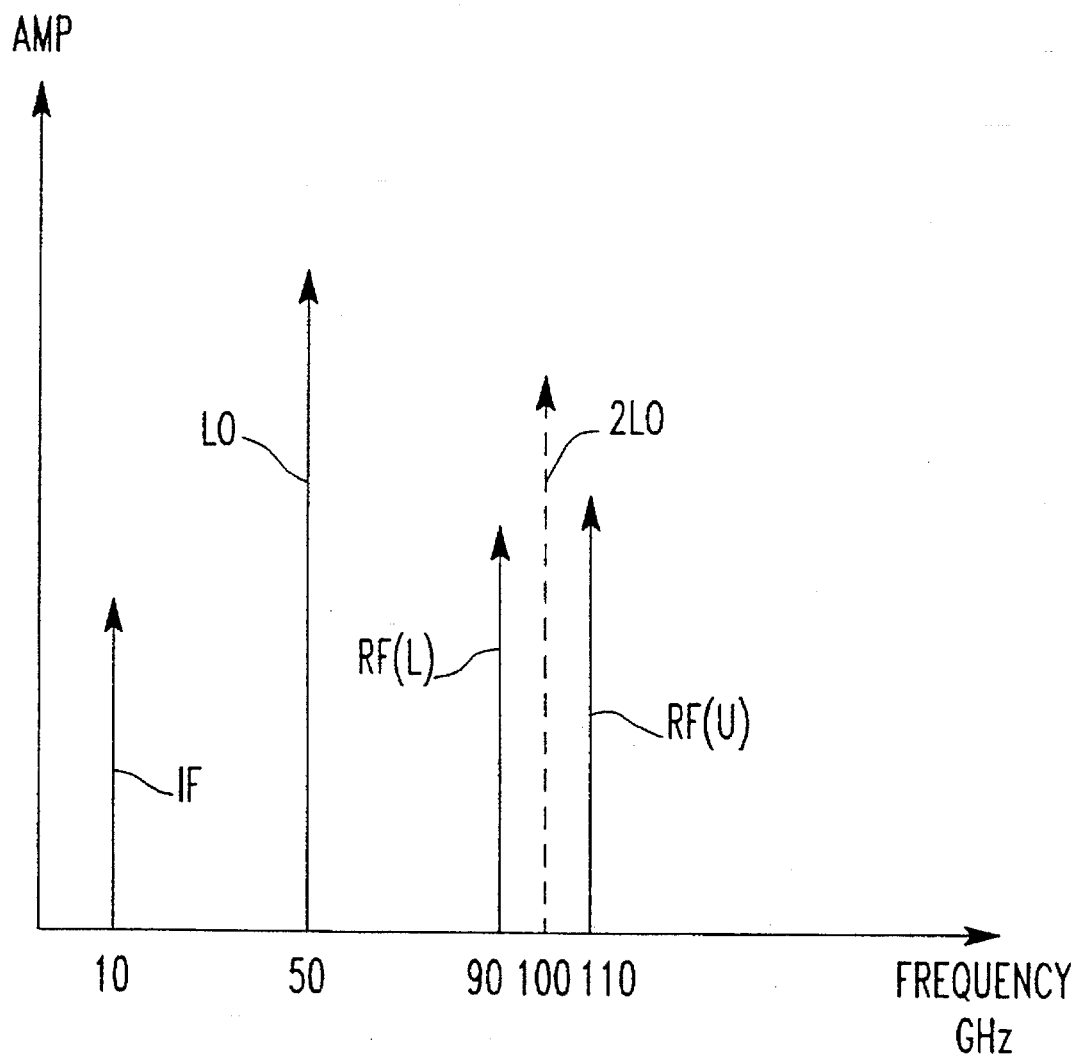
FIG. 2 is a diagram of the frequencies used in the subharmonic rejection and image enhancement mixer of the present invention.

Referring to FIG. 2, the mixer of the present invention may be incorporated into a receiver having a local oscillator signal $f_{LO}$ of 50 GHZ for example. The subharmonic mixers 16 and 16' would then operate at an effective local oscillator frequency $f_{2LO}$ of 100 GHZ. If the desired RF frequency $f_{RF(U)}$ is 110 GHz, the image RF frequency $f_{RF(L)}$ would be 90 GHz. The difference between $f_{2LO}$ and $f_{RF(U)}$ and $f_{2LO}$ and $f_{RF(L)}$ equals 10 GHz, which corresponds to the intermediate frequency $f_{IF}$.

The mixing by the first subharmonic mixer 16 of the local oscillator frequency $f_{LO}$ with the input signal RF, in other words, results in an intermediate frequency $f_{IF}$ having two components. A desired IF component $f_{IF(U)}$ is that portion caused by the mixing of the desired RF frequency $f_{RF(U)}$ of the input signal RF with the local oscillator frequency $f_{LO}$. In other terms, $f_{IF(U)}=f_{RF(U)}-f_{2LO}$. An image IF component $f_{IF(L)}$ of the intermediate frequency output $f_{IF}$ is that portion caused by the mixing of the image RF frequency $f_{RF(L)}$ of the input signal RF with the local oscillator frequency $f_{LO}$. In other terms, $f_{IF(L)}=f_{2LO}-f_{RF(L)}$. Of course, the frequency of the desired IF component $f_{IF(U)}$ equals the frequency of the image IF component $f_{IF(L)}$. Because the local oscillator frequency $f_{LO}$, the desired RF frequency $f_{RF(U)}$, and the image RF frequency $f_{RF(L)}$ at the inputs to the first subharmonic mixer 16 are substantially in phase, the desired IF component $f_{IF(U)}$ and the image IF component $f_{IF(L)}$ are substantially in phase at the output 36 of the first subharmonic mixer 16.

The mixing by the second subharmonic mixer 16' of the local oscillator frequency $f_{LO}$ with the input signal RF also results in an intermediate frequency output $f_{IF}$ having two components. The mixing of the desired frequency component $f_{RF(U)}$ with the local oscillator frequency $f_{LO}$ results in an input IF component $f_{IF(U)}$. Likewise, mixing of the local oscillator frequency $f_{LO}$ with the image RF frequency $f_{RF(L)}$ of the input signal RF results in an image IF component $f_{IF(L)}$ at the output 38 of the second subharmonic mixer 16'. The phase of the input signal RF at 30 is substantially identical to the phase of the signal RF at 32. The phase of the delayed local oscillator signal LO at 26 lags the phase of the local oscillator signal LO at 22 by (90°/n). For purposes of illustration, the phases of the input signal RF and the local oscillator signal LO are designated as 0°. Because the phase shifter 14 is coupled to the local oscillator input 26 of the second harmonic mixer 16', the phase of the local oscillator frequency $f_{LO}$ lags the phase of the input signal RF by 45° at the input to the second subharmonic mixer 16'. Consequently, the phase of the desired IF component $f_{IF(U)}$ differs from the phase of the image IF component $f_{IF(L)}$ by 180° at the output 38 of the second subharmonic mixer 16'. Specifically, the output 38 comprises $f_{IF(U)}=(f_{RF(U)}-f_{2LO})[90°]$ and $f_{IF(L)}=(f_{2LO}-f_{RF(L)})[-90°]$.

Referring again to FIG. 1, a quadrature hybrid 18 separates the desired IF components $f_{IF(U)}$ from the image IF components $f_{IF(L)}$ produced by the two subharmonic mixers 16 and 16'. Specifically, the quadrature hybrid 18 is a 90° IF hybrid or the like. The quadrature hybrid 18 comprises a first input 36 from subharmonic mixer 16, a second input 38 from subharmonic mixer 16', a first output 42, and a second output 44. As is evident to one of ordinary skill in the art, a signal at the first input 36 will be divided between the first and second outputs 42 and 44, with the phase of the second output 44 lagging the phase of the first output 42 by 90°. Likewise, a signal at the second input 38 will be divided between the first and second outputs 42 and 44, with the phase of the first output 42 lagging the phase of the second output 44 by 90°.

As mentioned, the output 36 from the first subharmonic mixer 16 includes a desired IF component $f_{IF(U)}$ and an image IF component $f_{IF(L)}$ of the intermediate frequency $f_{IF}$, both having a phase substantially of 0°. Consequently, the desired IF component $f_{IF(U)}$ and the image IF component $f_{IF(L)}$ appear at the first output 42 of the quadrature hybrid 18, both components having a phase of substantially 0°, and at the second output 44 of the quadrature hybrid 18, both components having a phase of substantially −90°. The power of each component $f_{IF(U)}$ and $f_{IF(L)}$ at the first output 42 and the second output 44 is one-half the power of that component at the first input 36 to the quadrature hybrid 18.

The output 38 from the second subharmonic mixer 16' includes a desired IF component $f_{IF(U)}$ at a phase of substantially 90° and an image IF component $f_{IF(L)}$ at a phase of substantially −90°. The desired IF component $f_{IF(U)}$ from the second input 38 of the quadrature hybrid 18, therefore, appears at the second output 44 at a phase of 90° and at the first output 42 at a phase of 0°. The image IF component $f_{IF(L)}$ from the second input 38 of the quadrature hybrid 18 appears at the second output 44 at a phase of −90° and at the first output 42 at a phase of −180°. The power of each component $f_{IF(U)}$ and $f_{IF(L)}$ at the first output 42 and the second output 44 is one-half the power of that component at the second input 38 to the quadrature hybrid 18.

Due to the phase relationships of the desired IF components $f_{IF(U)}$ and the image IF components $f_{IF(L)}$, the image IF components $f_{IF(L)}$ cancel at the first output 42 of the quadrature hybrid 18, and the desired IF components $f_{IF(U)}$ cancel at the second output 44. That is, at the first output 42 the image IF component $f_{IF(L)}$ at a phase of −180° cancels the image IF component $f_{IF(L)}$ at a phase of 0°. At the second output 44, the desired IF component $f_{IF(U)}$ at a phase of −90° cancels the desired IF component $f_{IF(L)}$ at a phase of 90°. Hence, only the desired IF component $f_{IF(U)}$ of the intermediate frequency $f_{IF}$ appears at the first output 42 of the quadrature hybrid 18, and only the image IF component $f_{IF(L)}$ of the intermediate frequency $f_{IF}$ appears at the second output 44.

The separated image IF component $f_{IF(L)}$ of the intermediate frequency $f_{IF}$ at the second output 44 may be terminated in a load, as is readily known to one of ordinary skill in the art. This separation and termination of the image IF component $f_{IF(L)}$ of the intermediate frequency $f_{IF}$ is also known as image rejection. Because the image IF component $f_{IF(L)}$ is unwanted noise, image rejection improves the noise figure of a receiver system having a low noise amplifier.

The arrangement of the input port 12 further reduces the conversion loss of the mixer in the present invention by incorporating image enhancement. In the mixing process, each subharmonic mixer 16 and 16' generates harmonics of the input signals. Some of these harmonics originate from the desired RF component $f_{RF(U)}$ and, therefore, contain information sought by the receiver system. As these harmonics exit the subharmonic mixers 16 and 16' through the input signal inputs 30 and 32, a quantity of information from the input signal is lost.

In particular, the mixing of the desired RF frequency $f_{RF(U)}$ with the local oscillator frequency $f_{LO}$ in each of the X2 subharmonic mixers 16 and 16' produces a spurious harmonic signal that emanates from the input signal port on each subharmonic mixer. This harmonic is referred to as a self-generated image signal I and has a frequency $f_I = f_{4LO} - f_{RF(U)}$ for the n=2 case. Because the local oscillator frequency $f_{LO}$ and the desired RF frequency $f_{RF(U)}$ that enter the first subharmonic mixer 16 have a phase of 0° in FIG. 1, the self-generated image signal I from the first subharmonic mixer also has a phase of 0°. Due to the 45° phase lag of the local oscillator frequency $f_{LO}$ to the second subharmonic mixer 16', the self-generated image signal I from the second subharmonic mixer has a phase of 180°.

The input port 12 functions to reflect the two self-generated image signals I back into each respective subharmonic mixer 16 or 16', thereby decreasing the conversion loss of the overall mixer. Due to the 180° phase difference between the two self-generated image signals I, point A between the first and second output arms 30 and 32 of the input port 12 becomes a virtual short circuit. The virtual short circuit causes the two self-generated image signals I to reflect back into the RF signal input 30 and 32 of each subharmonic mixer 16 and 16'. Neither self-generated image signal I therefore appears at the input arm 28 of the input port 12.

To minimize the conversion loss, the self-generated image signal I that appears at the RF signal input terminals of each mixer 30 and 32, should not see a resistive termination for minimum conversion loss, but a reactive load. An open circuit at a diode terminal produces the lowest loss, but requires high impedance levels for minimum conversion loss. A short circuit at the diode terminal results in a conversion loss only slightly higher than the open circuited case, but with reasonable impedance levels for low conversion loss.

As mentioned, the first output arm 30 of the input port 12 between points A and B and the second output arm 32 between A and C are dimensioned to be substantially equal to one another in length. The length of the output arms can be dimensioned in order to adjust the relative phase of the reflected self-generated image signal I so that the subharmonic mixer 16 and 16' at the RF signal input results in minimum conversion loss. The frequency of the self-generated image signal I will, of course, fluctuate as the frequency of the desired RF frequency $f_{RF(U)}$ of the input signal RF fluctuates. Preferably, the length of the output arms should be adjusted to provide an optimum phase for minimum conversion loss for the self-generated image signal I when the desired RF frequency $f_{RF(U)}$ is in the center of the frequency band for the receiver. Low conversion loss will still result, however, for frequencies near the center of the receiver band.

The self-generated image signal I that is reflected back into each of the subharmonic mixers 16 and 16' mixes with the local oscillator frequency $f_{LO}$ at the respective local oscillator input 22 or 26. The first subharmonic mixer 16 produces the intermediate frequency $f_{IF}$ at a phase of 0° from the self-generated image signal I. Due to the 180° phase of the self-generated image frequency $f_I$ at the input signal input 32, the second subharmonic mixer 16' produces the intermediate frequency $f_{IF}$ at a phase of 90°. As a result, the quadrature hybrid 18 then sums the intermediate frequencies $f_{IF}$ derived from the self-generated image signals at the first output, as described above.

Figure 3:
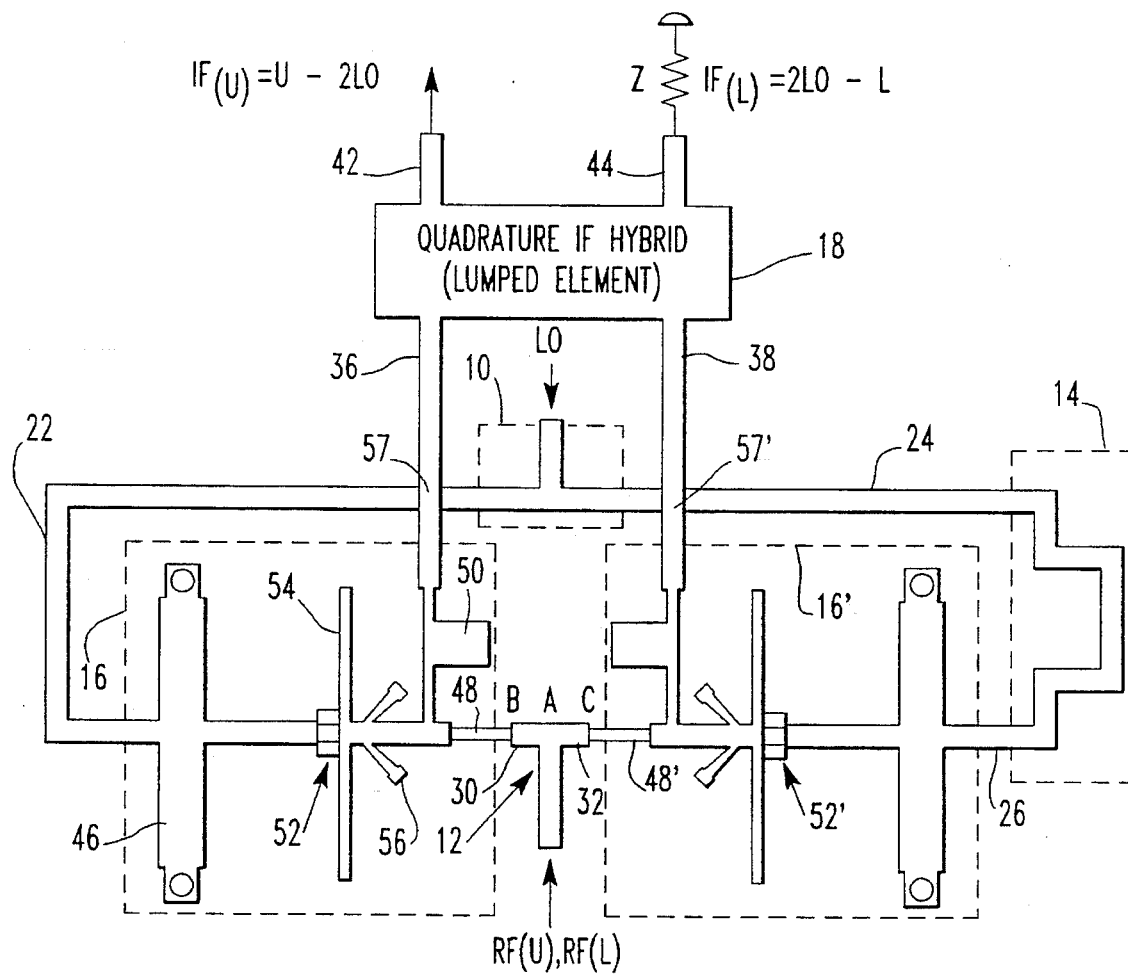
FIG. 3 is a layout of the subharmonic image rejection and image enhancement mixer according to the first embodiment of the present invention.

As shown in FIG. 3, an actual implementation of a subharmonic image rejection and image enhancement mixer comprises a pattern of conductive paths on a dielectric substrate. This monolithic microwave integrated circuit (MMIC) uses a semi-insulative substrate, preferably gallium arsenide, with conductive paths or transmission lines of plated gold. As shown in FIG. 3, the local oscillator is connected to the two subharmonic mixers by a tee connection. Alternately, a Wilkinson power divider could be used.

The power divider 10, which serves as the input for the local oscillator signal LO, comprises a perpendicular arrangement of two conductive paths. The first output arm 22 is connected to the first subharmonic mixer 16, and the second output arm 24 is connected to the phase shifter 14.

The phase shifter 14 for delaying the local oscillator signal LO to the second subharmonic filter 16' comprises an additional length of transmission line. To attain a phase delay of 45°, for example, the additional length of line is dimensioned to be equal to one-eighth the wavelength of the local oscillator frequency $f_{LO}$. The additional length of line is coupled to the local oscillator input 26 of the second subharmonic mixer 16'.

Each of the subharmonic mixers 16 and 16' comprises a series of filters along with an anti-parallel diode pair 52. Although the subharmonic mixers 16 and 16' may be either single-ended, balanced, or double-balanced mixers, the actual implementation of the present invention uses a balanced anti-parallel arrangement as shown in FIG. 3. For each subharmonic mixer 16 and 16', the input and output signals pass through filters that prohibit certain frequencies from entering or escaping the subharmonic mixer. The local oscillator signal LO first enters a short circuit stub 46 that allows the local oscillator frequency $f_{LO}$ to pass, but filters the desired RF frequency $f_{RF(U)}$ and the intermediate frequency $f_{IF}$. Similarly, the input signal RF enters each subharmonic mixer 16 through a coupled line filter 48. The coupled line filter 48 passes the desired RF frequency $f_{RF(U)}$ but filters the intermediate frequency $f_{IF}$. The intermediate frequency $f_{IF}$ produced by each subharmonic mixer 16 passes through a first open stub 50 that rejects the input signal RF.

An anti-parallel diode pair 52 mixes the local oscillator frequency $f_{LO}$ and the input signal RF in a nonlinear process readily known in the art. This non-linear mixing results in frequencies equal to both the difference and the sum of twice the local oscillator frequency $f_{LO}$ and the input signal RF. A second open stub 54 passes the resulting difference, or intermediate frequency $f_{IF}$, from the anti-parallel diode pair 52 but filters the local oscillator frequency $f_{LO}$. Two radial stubs 56 located next to the second open stub 54 reactively terminate the sum frequencies produced in the mixing process. By reactively terminating the sum frequencies, the subharmonic mixers 16 and 16' convert more signal to the difference frequency during the non-linear mixing and thereby improve the conversion loss of the overall mixer. As mentioned above, the filters are tuned for optimal performance at the center of the receiver band.

The output 36 and 38 of each subharmonic mixer 16 and 16' is connected through a transmission line as a first or second input to the quadrature hybrid 18, respectively. Air bridges 57 and 57' provides the necessary separation between the transmission lines carrying the local oscillator frequency $f_{LO}$ from the power divider 10 to the subharmonic mixers 16 and 16' and the transmission lines carrying the intermediate frequency $f_{IF}$ to the 90° IF hybrid.

According to the implementation in FIG. 3, the 90° IF hybrid is a lumped element device. As is commonly known in the art, the lumped element type of quadrature hybrid comprises capacitors and inductors rather than transmission line and, therefore, is small in size. As discussed above, the 90° IF hybrid separates the desired IF component $f_{IF(U)}$ from the image IF component $f_{IF(L)}$ of the intermediate frequency $f_{IF}$. The image IF component $f_{IF(L)}$ is terminated through a load Z coupled to the second output of the 90° IF hybrid.

Alternatively, the present invention could be implemented on a substrate other than GaAs, such as quartz. GaAs provides a preferred substrate because the anti-parallel diode pair 52 can be incorporated on the same substrate as the rest of the circuit. An alternative substrate such as quartz may require a separate substrate for the diodes.

Figure 4:
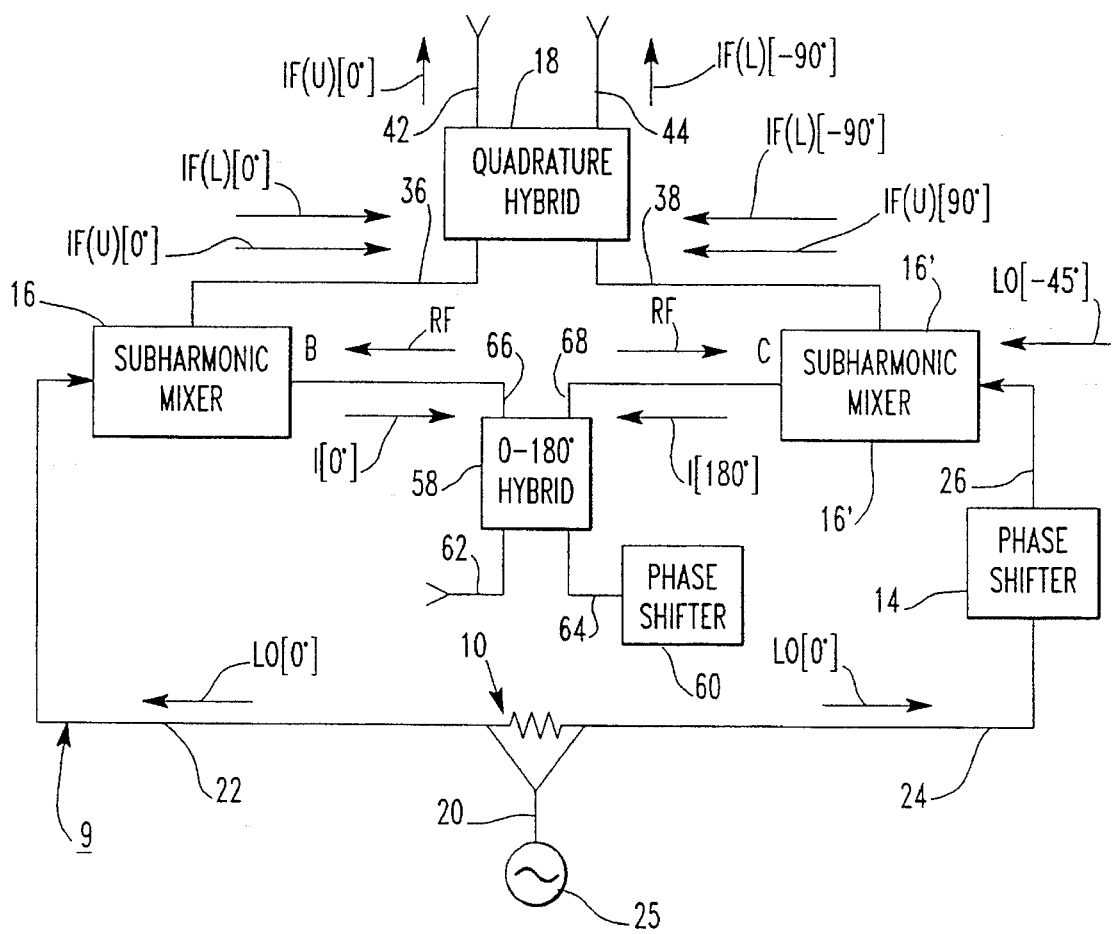
FIG. 4 is a schematic diagram of a subharmonic image rejection and image enhancement mixer according to a second embodiment of the present invention.

Referring to FIG. 4, a frequency mixer generally referred to as 9 according to a second embodiment of the present invention includes a 0°–180° hybrid 58 and a second phase shifter 60 to achieve image enhancement using an image short termination technique. The power divider 10, phase shifter 14, quadrature hybrid 18, and first and second subharmonic mixers 16 and 16' have the same configuration as described above for image rejection as the first embodiment of FIG. 1.

The 0°–180° hybrid 58, or the like, comprises a sum port 62, a difference port 64, a first subharmonic port 66, and a second subharmonic port 68. The sum port 62 serves as a second input to the mixer and receives the input signal RF from an external source. The first subharmonic port 66 and second subharmonic port 68 are connected to the input signal inputs on the first and second subharmonic mixers 16 and 16', respectively. As is evident to one of ordinary skill in the art, the input signal RF at the sum port 62 will be divided equally between the first subharmonic port 66 and the second subharmonic port 68 without any phase shift.

If the phase of a signal at the second subharmonic port 68 leads or lags the phase of a signal at the first subharmonic port 66 by 180°, the 0°–180° hybrid 58 will produce the difference of the two signals in phase at the difference port 64. As mentioned, the self-generated image frequency $f_I$ that emanates from the second subharmonic mixer 16' after the mixing of $f_{RF(U)}$ with $f_{LO}$ will differ from the self-generated image frequency $f_I$ that emanates from the first subharmonic mixer 16 by 180°. The difference of these two self-generated image signals I will appear at the difference port 64 in phase.

The second phase shifter 60 is coupled between the difference port 64 of the 0°–180° hybrid 58 and a termination. The combined self-generated image signal I that passes through the difference port 64 of the 0°–180° hybrid 58 travels through the second phase shifter 60 to the termination, either a ground or an open. Upon reaching the termination, the combined self-generated image signal I is reflected back through the second phase shifter 60 to the difference port 64 of the 0°–180° hybrid 58.

A signal that enters the difference port 64 of the 0°–180° hybrid 58 will be divided between the first subharmonic port 66 and the second subharmonic port 68, with the phase of the signal at the second subharmonic port 68 differing from the phase of the signal at the first subharmonic port 66 by 180°. As depicted in FIG. 4, the reflected self-generated image signal I that enters the difference port 64 from the second phase shifter 60 will appear at the first subharmonic port 66 with a phase of 0° and at the second subharmonic port 68 with a phase of 180°. The reflected self-generated image signal I at a phase of 0° enters the RF signal input of the first subharmonic mixer 16, and the signal I at a phase of 180° enters the second subharmonic mixer 16'. The length of the lead 66 should substantially equal the length of lead 68 connecting with the mixers. As discussed above for the first embodiment, the mixing of the self-generated image signals I with the local oscillator signal LO decreases the conversion loss of the overall mixer.

The second phase shifter 60 functions to minimize conversion loss. The phase shifter can adjust the phase of the reflected self-generated image signal I for optimal conversion loss. Preferably, the phase shift should be adjusted to provide optimal conversion loss for the self-generated image signal I when the desired RF frequency $f_{RF(U)}$ is in the center of the frequency band for the receiver. As for the first embodiment, when the desired RF frequency $f_{RF(U)}$ is not in the center of the band, low conversion loss will still result.

The image short termination technique for image enhancement shown in FIG. 4 provides an easier method for adjusting the phase of the reflected self-generated image signal I over the virtual image short termination technique described in FIG. 1. The second phase shifter 60 in FIG. 4 provides the only phase adjustment, rather than both the first and second output arms 30 and 32 of the input port 12 in FIG. 1. The use of the 0°–180° hybrid 58 with image short termination, however, causes an increased loss of recoverable energy from the signal I. Each of the two passes through the 0°–180° hybrid 58 by the self-generated image signal I results in some loss to the signal that does not occur with virtual image short termination.

Figure 5:
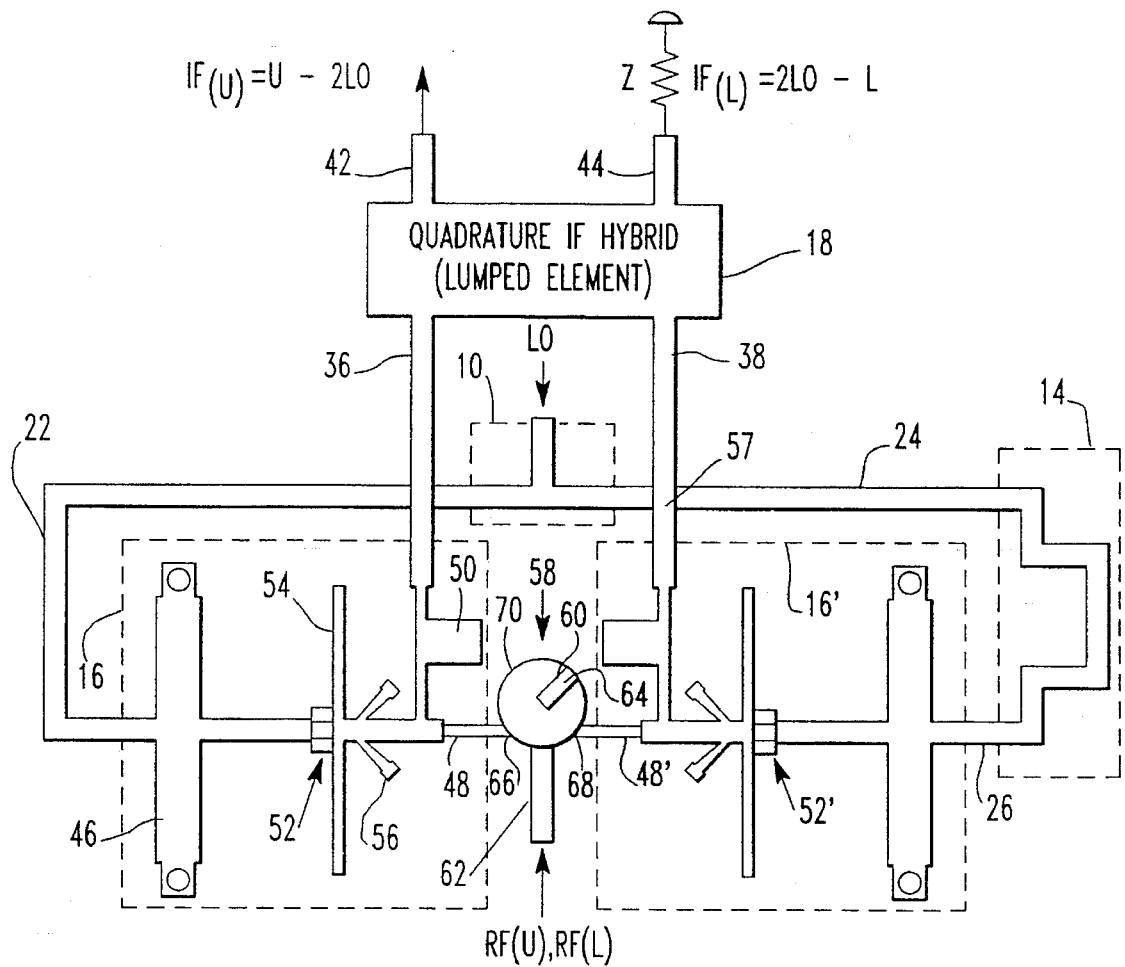
FIG. 5 is a layout of the subharmonic image rejection and image enhancement mixer according to the second embodiment of the present invention.

Referring to FIG. 5, the actual implementation of the second embodiment of the present invention comprises a circuit layout similar to that depicted for image rejection shown in FIG. 3, along with a rat race coupler 58. The MMIC structure also uses a semi-insulative substrate, preferably gallium arsenide, with conductive paths or transmission lines of plated gold.

The rat race coupler 58 serves as the 0°–180° hybrid and the second phase shifter 60 described in FIG. 4. The length of the conductive circle 70 enclosing the rat race coupler 58 is set to equal one and one-half wavelengths of the desired RF frequency $f_{RF(U)}$ at the center of the receiver band. The input signal RF enters the sum port 62 of the 0°–180° hybrid 58 at the lower section of the rat race coupler. The distance of the conductive circle 70 between the sum port 62 and the first subharmonic port 66 equals one quarter of a wavelength of $f_{RF(U)}$. Therefore, the input signal RF undergoes a 90° phase shift between the sum port 62 and the first subharmonic port 66. Likewise, the input signal RF undergoes a 90° phase shift along the conductive circle 70 between the sum port 62 and the second subharmonic port 68. The first subharmonic port 66 is connected directly to a coupled line filter 48 at the RF signal input 34 of the first subharmonic mixer 16, and the second subharmonic port 68 is connected directly to a coupled line filter 48' at the RF signal input of the second subharmonic mixer 16'. The input signal RF, therefore, passes to the first and second subharmonic mixers 16 and 16' substantially in phase.

The distance along the conductive circle 70 between the first subharmonic port 66 and the difference port 64 equals three-quarters of a wavelength of $f_{RF(U)}$. For the example shown, the self-generated image signal I enters the first subharmonic port 66 at a phase of 0° and exits the difference port 64 at a phase of 90°. Similarly, the distance along the conductive circle 70 between the second subharmonic port 68 and the difference port 64 equals one quarter of a wavelength of $f_{RF(U)}$. The self-generated image signal I enters the second subharmonic port 68 at a phase of 180° and also exits the difference port 64 at a phase of 90°.

The second phase shifter 60 comprises an additional length of transmission line extending from the difference port 64 to termination. The length of the transmission line is chosen to minimize the conversion loss.

Thus, the present invention accomplishes image rejection and image enhancement for millimeter wavelength systems by employing subharmonic mixers. Virtual image short termination and image short termination help to convert self-generated image signals to the intermediate frequency, thereby reducing the conversion loss.

It will be apparent to those skilled in the art that various modifications and variations can be made to the present invention without departing from the spirit or scope of the present invention. For instance, while the present invention has been described for X2 subharmonic mixers using twice the local oscillator frequency, the phasing relationships may be readily determined for application of this technique to other types of subharmonic mixers. Thus, it is intended that the present invention cover the modifications and variations of this invention provided they come within the scope of the appended claims and their equivalents.

We claim:

1. A frequency mixer for combining an input signal with a local oscillator frequency to obtain an intermediate frequency, the input signal having at least a desired frequency and an image frequency, the desired frequency and the image frequency being offset from a multiple n of the local oscillator frequency by the intermediate frequency, comprising:

a power divider having and input for receiving the local oscillator frequency, a first output, and a second output;

a phase shifter for delaying the local oscillator frequency by (90°/n) having an input coupled to the first output of the power divider and an output, n being greater than 1;

input means for applying the input signal to a first and a second subharmonic mixer and for reflecting a self-generated image signal into one of said first and second subharmonic mixers, said input means having a first output arm and a second output arm;

said first subharmonic mixer having a first local oscillator input coupled to the second output of said power divider, a first input signal input coupled to the first output arm of said input means, and a first mixer output, the first subharmonic mixer producing the intermediate frequency at the first mixer output, said intermediate frequency including a first desired component and a first image component;

said second subharmonic mixer having a second local oscillator input coupled to the output of said phase shifter, a second input signal input coupled to the second output arm of said input means, and a second mixer output, the second subharmonic mixer producing the intermediate frequency at the second mixer output, said intermediate frequency including a second desired component and a second image component; and a quadrature hybrid having a first input coupled to the output of said first subharmonic mixer, a second input coupled to the output of said second subharmonic mixer, a first output, and a second output, the quadrature hybrid producing a sum of said first desired component and said second desired component at the first output and a sum of said first image component and said second image component at the second output;

wherein the first and second subharmonic mixers further comprise an anti-parallel diode pair for mixing the local oscillator frequency and the input signal, a coupled line filter for passing the input signal, a short circuit stub for passing the local oscillator frequency, a first open stub for rejecting the input signal and passing the intermediate frequency, a second open stub for passing the intermediate frequency, and a radial stub for terminating a sum frequency.

2. The frequency mixer of claim 1, wherein said input means comprises an input port having an input arm, the first output arm, and the second output arm, each of said output arms having first and second ends with the first end of the first output arm being joined to the first end of the second output arm and to the input arm, the first output arm and the second output arm being substantially equal in length between the respective first and second ends.

3. The frequency mixer of claim 1, wherein the frequency mixer is constructed on a substrate of gallium arsenide.

4. The frequency mixer of claim 1, wherein the quadrature hybrid is a lumped element device.

5. The frequency mixer of claim 1, wherein said input means comprises a 0°–180° hybrid having a sum port, a difference port, the first output arm, and the second output arm, the first output arm and the second output arm being substantially equal in length, and a second phase shifter coupled between the difference port of said 0°–180° hybrid and a termination.

6. The frequency mixer of claim 5, wherein the 0°–180° hybrid is a rat race coupler.

7. The frequency mixer of claim 5, wherein the 0°–180° hybrid is a lumped element device.

* * * * *